(12) United States Patent
Ueno

(10) Patent No.: US 9,075,087 B2
(45) Date of Patent: Jul. 7, 2015

(54) VOLTAGE DETECTION CIRCUIT, ECU, AUTOMOBILE WITH ECU

(75) Inventor: Masaji Ueno, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 427 days.

(21) Appl. No.: 13/419,399

(22) Filed: Mar. 13, 2012

(65) Prior Publication Data
US 2012/0306516 A1 Dec. 6, 2012

(30) Foreign Application Priority Data

Jun. 1, 2011 (JP) .................. 2011-123602

(51) Int. Cl.
*G01R 19/00* (2006.01)
(52) U.S. Cl.
CPC .................. *G01R 19/0084* (2013.01)
(58) Field of Classification Search
CPC ............ G05B 23/02; G05B 23/0205; G05B 23/0235; G05B 23/0291; G01R 31/006; G01R 19/084
USPC ........................................................ 324/713
See application file for complete search history.

(56) References Cited

U.S. PATENT DOCUMENTS

| | | | | |
|---|---|---|---|---|
| 4,910,455 A | * | 3/1990 | Nadd | 324/123 R |
| 5,897,596 A | * | 4/1999 | Kabune et al. | 701/29.2 |
| 6,522,955 B1 | * | 2/2003 | Colborn | 700/286 |
| 7,777,479 B2 | * | 8/2010 | Huang et al. | 324/750.01 |
| 2007/0139083 A1 | * | 6/2007 | Mirea et al. | 327/77 |
| 2008/0297963 A1 | * | 12/2008 | Lee et al. | 361/87 |
| 2009/0002901 A1 | * | 1/2009 | Matsumoto et al. | 361/18 |

FOREIGN PATENT DOCUMENTS

| | | | |
|---|---|---|---|
| CN | 1480735 A | | 3/2004 |
| CN | 1624486 A | | 6/2005 |
| CN | 101916984 A | | 12/2010 |
| JP | 2000-065870 | | 3/2000 |
| JP | 2010245988 A | * | 10/2010 |

OTHER PUBLICATIONS

Chinese Office Action dated Jan. 20, 2014 with English translation, China Patent Application No. 201210069351.9 filed Mar. 15, 2012, 16 pages.
Chinese Office Action dated Aug. 29, 2014 with English translation, Chinese Patent Application No. 201210069351.9.

* cited by examiner

*Primary Examiner* — Jeff Natalini
(74) *Attorney, Agent, or Firm* — Patterson & Sheridan, LLP

(57) ABSTRACT

According to an embodiment, the threshold value generation unit generates a setting voltage and converts the setting voltage to a first current. One end of the first resistor is connected to a detection terminal. When a voltage applied to the detection terminal is greater than or equal to a predetermined factor times the voltage of the higher voltage source, the detection unit causes a constant detection terminal input current to flow from the detection terminal to the first resistor. When the voltage at the detection terminal is less than the predetermined factor times the voltage of the higher voltage source, a higher voltage source voltage is outputted to a detection output terminal, while the voltage at the detection terminal is greater than or equal to the predetermined factor times the voltage of the higher voltage source, a lower voltage source voltage is outputted to the detection output terminal.

13 Claims, 10 Drawing Sheets

VOLTAGE DETECTION CIRCUIT, ECU, AUTOMOBILE WITH ECU

CROSS REFERENCE TO RELATED APPLICATION

This application is based upon and claims the benefit of priority from the prior Japanese Patent Application No. 2011-123602, filed on Jun. 1, 2011, the entire contents of which are incorporated herein by reference.

FIELD

Embodiments described herein relate to a voltage detection circuit, an ECU, and an automobile including an ECU.

BACKGROUND

In an electronic system to be mounted on a vehicle or the like, a plurality of relatively low voltages is generated by a battery or a battery pack. The plurality of generated voltages is applied to electronic devices. An in-vehicle driver is provided with a voltage detection circuit configured to detect an accidental short-to-power from a power source having a relatively high voltage generated by a battery or a battery pack, and to protect a circuit unit controlled by an ECU (electronic control unit) or the like from damage caused by the short-to-power. The voltage detection circuit includes a resistance dividing circuit and a detection comparator.

When a detection terminal voltage becomes high due to a short-to-power of a battery or a battery pack, a detection terminal input current occurs. There is a problem in that the detection terminal input current is increased as the detection terminal voltage increases. In addition, there is a problem in that once the detection terminal voltage reaches a predetermined voltage or higher and exceeds the breakdown voltage of a detection comparator, the detection comparator deteriorates or breaks. Adding a diode clamping circuit as a solution to prevent the deterioration or breakage of the detection comparator brings about a problem in that the detection terminal input current is again increased.

DETAILED DESCRIPTION

Figure 1:
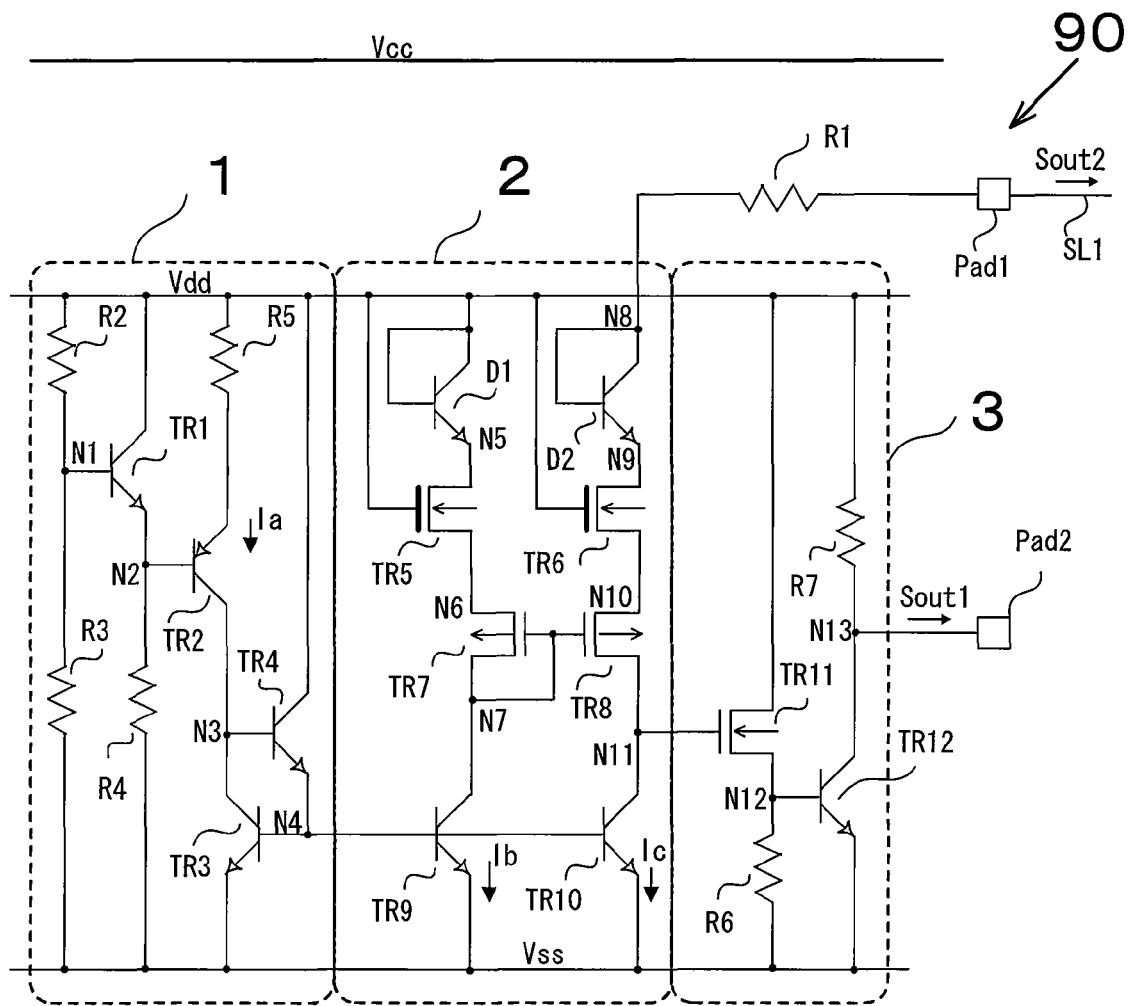
FIG. 1 is a circuit diagram illustrating the configuration of a voltage detection circuit according to a first embodiment.

According to an embodiment, a voltage detection circuit includes a threshold value generation unit, a first resistor, a detection unit, and a detection output unit. The threshold value generation unit is provided between a higher voltage source and a lower voltage source to generate a setting voltage and converts the setting voltage to a first current. One end of the first resistor is connected to a detection terminal. A detection unit is provided between the higher voltage source and the lower voltage source, and is connected to the other end of the first resistor so as to detect a first current. When a voltage applied to the detection terminal is greater than or equal to a predetermined factor times the voltage of the higher voltage source, the detection unit causes a constant detection terminal input current to flow from the detection terminal to the first resistor. The detection output unit is provided between the higher voltage source and the lower voltage source, and an output signal of the detection unit is inputted to the detection output unit. When the voltage at the detection terminal is less than the predetermined factor times the voltage of the higher voltage source, a first signal is outputted to a detection output terminal, while the voltage at the detection terminal is greater than or equal to the predetermined factor times the voltage of the higher voltage source, a second signal is outputted to the detection output terminal.

According to another embodiment, an ECU includes an output drive unit, a voltage detection circuit, and a control unit to control the output drive unit. The ECU outputs an output drive signal from the output drive unit. The output drive unit outputs an output drive signal for driving the target controlled unit. The voltage detection circuit has a threshold value generation unit, a first resistor, a detection unit, and a detection output unit. The threshold value generation unit is provided between the higher voltage source and the lower voltage source to generate a setting voltage which is lower than the voltage of the higher voltage source, and converts the setting voltage to a first current. One end of the first resistor is connected to a detection terminal. A detection unit is provided between the higher voltage source and the lower voltage source, and is connected to the other end of the first resistor so as to detect a first current. When a voltage applied to the detection terminal is greater than or equal to (the voltage of the higher voltage source+the setting voltage), the detection unit causes a constant detection terminal input current to flow from the detection terminal to the first resistor. The detection output unit is provided between the higher voltage source and the lower voltage source, and an output signal of the detection unit is inputted to the detection output unit. When the voltage at the detection terminal is less than (the voltage of the higher voltage source+the setting voltage), a first signal is outputted to a detection output terminal, while the voltage at the detection terminal is greater than or equal to (the voltage of the higher voltage source+the setting voltage), a second signal is outputted to the detection output terminal. A signal outputted from the detection output unit via the detection output terminal is inputted to the control unit. When a voltage applied to the detection terminal is greater than or equal to (the voltage of the higher voltage source+the setting voltage), the control unit outputs a control signal to stop the operation of the output drive unit.

Hereinafter, a plurality of further embodiments will be described with reference to the drawings. In the drawing, the same reference symbols indicate the same or similar portions.

Figure 9:
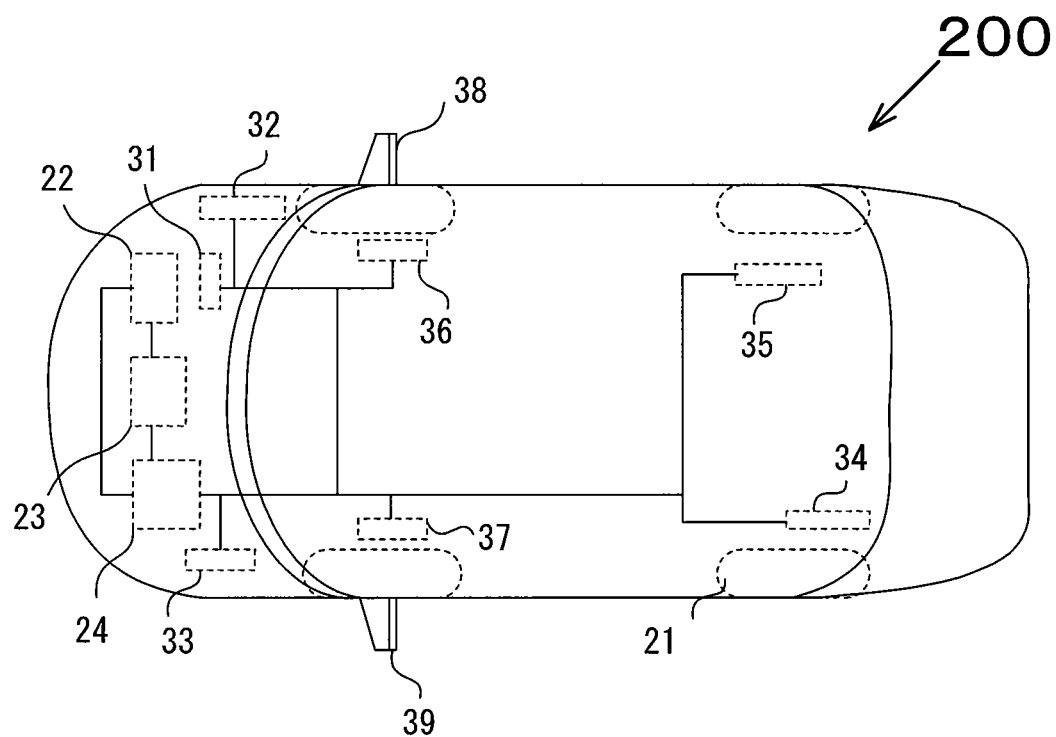
FIG. 9 is a diagram illustrating the schematic configuration of an automobile including an ECU according to an embodiment.
Figure 10:
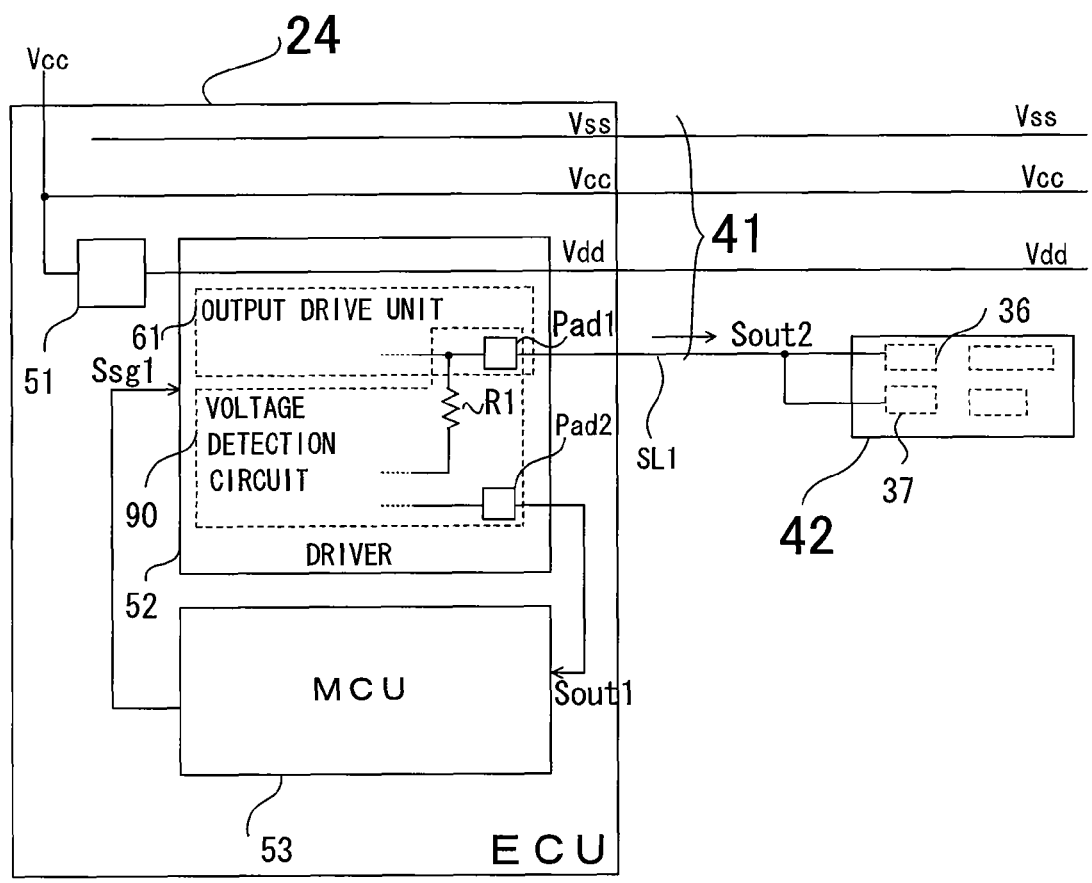
FIG. 10 is a schematic diagram illustrating an ECU, a target controlled unit, and a wire harness according to an embodiment.

A voltage detection circuit, an ECU, and an automobile including an ECU according to embodiments will be described with reference to FIGS. 9 and 10. FIG. 9 is a diagram illustrating the schematic configuration of an automobile including the ECU. FIG. 10 is a schematic diagram illustrating the ECU, a target controlled unit, and a wire harness.

As illustrated in FIG. 9, an automobile 200 includes a tire 21, an engine 22, a power source 23, an ECU 24, sensors 31 to 34, a switch 35, a motor 36, a motor 37, a mirror 38, and a mirror 39.

The ECU (electronic control unit for automobiles) 24 performs electronic control in the automobile 200. Normally, the automobile 200 is provided with four tires 21. The power source 23 includes a battery or a battery pack. The battery generates a higher voltage source of 12 V, and the battery pack generates a higher voltage source in a range from several dozen V to several hundred V. The higher voltage source is supplied from the power source 23 to the engine 22, and the operation of the engine 22 is controlled by the ECU 24. The operations of the sensors 31 to 34, the switch 35, the motor 36, and the motor 37 are controlled by the ECU 24.

As illustrated in FIG. 10, the ECU 24 includes a regulator 51, a driver 52, and an MCU 53. A higher voltage source Vcc is supplied from the power source 23 to the ECU 24.

The higher voltage source Vcc is inputted from the power source 23 to the regulator 51, and a lowered higher voltage source Vdd is generated by the regulator 51. The regulator 51 is a synchronous rectification step-down switching regulator, for example.

The higher voltage source Vdd is supplied to the driver 52 as a semiconductor device. The driver 52 includes an output drive unit 61 and a voltage detection circuit 90. The output drive unit 61 outputs an output drive signal Sout2 via a signal line SL1 connected to a detection terminal Pad1. The output drive signal Sout2 is inputted to the motor 36 and the motor 37 of a target controlled unit 42 which are controlled by the ECU 24. The operations of the motor 36 and the motor 37 are controlled by the output drive signal Sout2. The motor 36 and the motor 37 are motors for power windows or for angle adjustment of the mirror 38 and the mirror 39, for example, and are operated with a relatively low voltage.

Various power source lines such as the higher voltage source Vcc, the higher voltage source Vdd, and the lower voltage source (ground potential) Vss, and various signal lines containing the signal line SL1 which transmits the output drive signal Sout2 outputted from the ECU 24 are supplied to various devices and circuits in the automobile 200 via a wire harness 41 connected to the ECU 24.

The voltage detection circuit 90 includes a resistor R1, the detection terminal Pad1, and a detection output terminal Pad2 (the detailed circuit configuration is described later.). When a short-to-power occurs (for example, when the signal line SL1 comes in contact with the higher voltage source Vcc), the voltage detection circuit 90 detects the voltage with the detection terminal Pad1, and outputs a detection output signal Sout1 from the detection output terminal Pad2. The voltage detection circuit 90 has functions of detecting a short-to-power and protecting circuits.

The MCU (micro controller unit) 53 as a control unit generates relatively low voltage control signals for controlling various devices and circuits in the automobile 200. The detection output signal Sout1 is inputted to the MCU 53 via the detection output terminal Pad2, for example, and outputs a control signal Ssg1 to the driver 52. When a short-to-power is detected by the voltage detection circuit 90, the MCU 53 outputs a control signal Ssg1 in a disable state to the driver 52, and stops the operation of the driver 52. By stopping the operation of the driver 52, the output drive signal Sout2 is no longer inputted to the motor 36 and the motor 37. Accordingly, a malfunction and an internal circuit breakage that are caused by a short-to-power of the motor 36 or the motor 37 are prevented. When no short-to-power is detected by the voltage detection circuit 90, the MCU 53 outputs a control signal Ssg1 in an enable state to the driver 52, and allows the driver 52 to operate.

Figure 2:
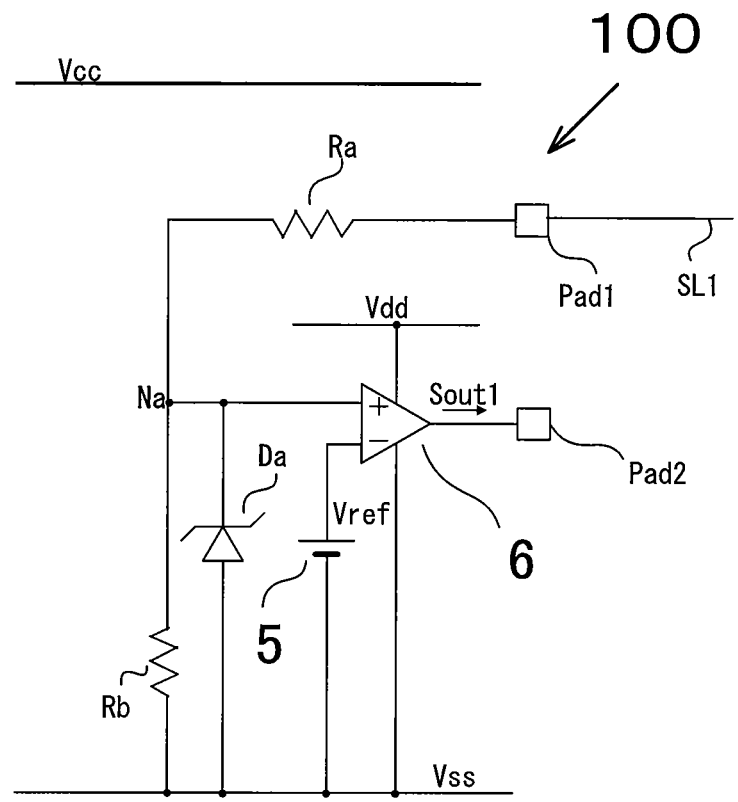
FIG. 2 is a circuit diagram illustrating the configuration of a voltage detection circuit of a comparative example.

Next, the voltage detection circuit provided in the driver 52 as a semiconductor device will be described with reference to the drawings. FIG. 1 is a circuit diagram illustrating the configuration of the voltage detection circuit. FIG. 2 is a circuit diagram illustrating the configuration of a voltage detection circuit of a comparative example. In the voltage detection circuit of the embodiment, the setting voltage, after being generated by the threshold value generation unit, is converted to a current, and the voltage difference between both ends of the resistor connected to the detection terminal is controlled by the detection unit so as to reduce the detection terminal input current which is generated in the case where a short-to-power occurs.

As illustrated in FIG. 1, the voltage detection circuit 90 includes a threshold value generation unit 1, a detection unit 2, a detection output unit 3, a resistor R1, a detection terminal Pad1, and a detection output terminal Pad2. A power source line for supplying the higher voltage source Vcc is provided in the vicinity of the voltage detection circuit 90. The higher voltage source Vcc is set higher than the higher voltage source Vdd which is supplied to the voltage detection circuit 90.

The voltage detection circuit 90 is used as a voltage detection circuit for a short-to-power of a driver due to a contact with the higher voltage source Vcc, for example. The voltage detection circuit 90 detects the higher voltage source Vcc with the detection terminal Pad1 when a short-to-power occurs due to the higher voltage source Vcc, and sets the detection output signal Sout1 outputted from the detection output terminal Pad2 to the level of the lower voltage source (ground potential) Vss, thereby serving to protect the driver 52 and the target controlled unit 42 which is operated with the output drive current Sout2. The driver may be a stepping motor driver, H bridge driver, or an output driver.

The threshold value generation unit 1 includes transistors TR1 to TR4, resistors R2 to R5. The threshold value generation unit 1 generates a setting voltage and converts the setting voltage to a current Ia.

One end of the resistor R2 is connected to the higher voltage source Vdd, and the other end of the resistor R2 is connected to a Node N1. One end of the resistor R3 is connected to the Node N1, and the other end of the resistor R3 is connected to the lower voltage source (ground potential) Vss. The resistors R2 and R3 serve as a resistance dividing circuit, and generate a setting voltage between both ends of the resistor R2, the setting voltage being (1/n) of the higher voltage source Vdd voltage (where n>1). In the subsequent description, as an example, the case is considered where an occurrence of a short-to-power is determined when the voltage at the detection terminal Pad1 reaches 1.1 times $\{1+(1/n)\}$ the higher voltage source Vdd voltage or higher, that is to say, the value of n is set to 10 by setting the resistances and the resistance ratio of the resistor R2 and the resistor R3 to predetermined values so that a setting voltage between both ends of the resistor R2 is generated, the setting voltage being 10% of the higher voltage source Vdd.

The transistor TR1 is an NPN transistor. A collector (a first terminal) of the transistor TR1 is connected to the higher voltage source Vdd, a base (control terminal) of the transistor TR1 is connected to the Node N1, and an emitter (a second terminal) of the transistor TR1 is connected to a Node N2. One end of the resistor R4 is connected to the Node N2, and the other end of the resistor R4 is connected to the lower voltage source (ground potential) Vss.

One end of the resistor R5 is connected to the higher voltage source Vdd. The current Ia flows from one end of the resistor R5 to the other end of the resistor R5. The transistor TR2 is a PNP transistor. An emitter (a first terminal) of the transistor TR2 is connected to the other end of the resistor R5, a base (control terminal) of the transistor TR2 is connected to the Node N2, and a collector (a second terminal) of the transistor TR2 is connected to a Node N3. The transistor TR3 is an NPN transistor. A collector (a first terminal) of the transistor TR3 is connected to the Node N3, a base (control terminal) of the transistor TR3 is connected to a Node N4, and an emitter (a second terminal) of the transistor TR3 is connected to the lower voltage source (ground potential) Vss. The transistor TR4 is an NPN transistor. A collector (a first terminal) of the transistor TR4 is connected to the higher voltage source Vdd, a base (control terminal) of the transistor TR4 is connected to the Node N3, and an emitter (a second terminal) of the transistor TR4 is connected to a Node N4.

The transistors TR3 and TR4 constitute a current mirror circuit. When the higher voltage source Vdd is supplied, the transistors TR3 and TR4 operate. The transistor TR4 corrects a reduction in the base current when the current amplification factor (hfe) increases, a variation in the base current due to a reduction in early voltage, and the like so as to flow a constant base current into the Node N4. Compared with the case where only the transistor TR3 is used, in which the base is connected to the collector, a stable current mirror circuit can be achieved.

The threshold value generation unit 1 redirect the setting voltage between both ends of the resistor R2 through the transistor TR1 and the transistor TR2, and converts the setting voltage to the current Ia by the resistor R5.

One end of the resistor R1 is connected to the detection terminal Path, and the other end of the resistor R1 is connected to a Node N8 of the detection unit 2. Here, the resistor R1 and the resistor R5 of the threshold value generation unit 1 are set to have the same resistance value.

The detection unit 2 includes transistors TR5 to TR10, a diode D1, and a diode D2. The detection unit 2 is designed such that the voltage between both ends of the resistor R1 becomes the same as the setting voltage between both ends of the resistor R2 when a short-to-power occurs.

The diode D1 includes an NPN transistor having a base connected to the collector. The diode D1 is provided between the higher voltage source Vdd and the Node N5. The diode D2 includes an NPN transistor having a base connected to the collector. The diode D2 is provided between the Node N8 and a Node N9.

The transistor TR5 is an N-channel high-voltage MOS transistor. A high-voltage MOS transistor is referred to as a power MOS transistor. A drain (a first terminal) of the transistor TR5 is connected to the Node N5, a gate (control terminal) of the transistor TR5 is connected to the higher voltage source Vdd, and a source (the second terminal) of the transistor TR5 is connected to a Node N6. The transistor TR5 is turned on when the higher voltage source Vdd is supplied to the transistor TR5.

The transistor TR6 is an N-channel high-voltage MOS transistor. A drain (a first terminal) of the transistor TR6 is connected to the Node N9, a gate (control terminal) of the transistor TR6 is connected to the higher voltage source Vdd, and a source (the second terminal) of the transistor TR6 is connected to a Node N10. The higher voltage source Vdd is supplied to the transistor TR6, and the transistor TR6 is turned on when the voltage at the detection terminal Pad1 reaches a predetermined voltage or higher.

Here, the high-voltage MOS transistor refers to a DMOS transistor, a trench power MOS transistor, and the like. Compared with a logic MOS transistor which is operated with a relatively low voltage, the high-voltage MOS transistor can set a higher gate-drain breakdown voltage, gate-source breakdown voltage, gate-substrate breakdown voltage, and drain-source breakdown voltage. Accordingly, even when a high voltage is applied, deterioration and breakage of a device can be significantly reduced.

The transistor TR7 is a P-channel MOS transistor. A source (a first terminal) of the transistor TR7 is connected to the Node N6, and a gate (control terminal) of the transistor TR7 is connected to a drain (a second terminal) and a Node N7. The transistor TR8 is a P-channel MOS transistor. A source (a first terminal) of the transistor TR8 is connected to the Node N10, a gate (control terminal) of the transistor TR8 is connected to the gate (control terminal) of the transistor TR7, and, a drain (a second terminal) of the transistor TR8 is connected to a Node N11.

The transistors TR7 and TR8 constitute a current mirror circuit. A MIS transistor or a junction FET may be used as the transistors TR7 and TR8 instead of an MOS transistor. Here, the operation of the transistors TR7 and TR8 is similar to that of a detection comparator which is used in a conventional voltage detection circuit. Consequently, it is not preferable to use an NPN transistor or a PNP transistor in which the base current flows.

The transistor TR9 is an NPN transistor. A collector (a first terminal) of the transistor TR9 is connected to the Node N7, a base (control terminal) of the transistor TR9 is connected to the Node N4 and the base (control terminal) of the transistor TR3, and an emitter (a second terminal) of the transistor TR9 is connected to the lower voltage source (ground potential) Vss. The transistor TR9 and the transistor TR3 constitute a current mirror circuit, and allows a current Ib to flow to the lower voltage source (ground potential) Vss.

The transistor TR10 is an NPN transistor. A collector (a first terminal) of the transistor TR10 is connected to the Node N11, a base (control terminal) of the transistor TR10 is connected to the Node N4 and the base (control terminal) of the transistor TR3, and an emitter (a second terminal) of the transistor TR10 is connected to the lower voltage source (ground potential) Vss. The transistor TR10 and the transistor TR3 constitute a current mirror circuit, and allows a current Ic to flow to the lower voltage source (ground potential) Vss when the transistor TR6 is turned on.

The detection output unit 3 includes transistors TR11, TR12, and resistors R6, R7. When the voltage applied to the detection terminal Pad1 is less than 1.1 times {1+(1/n), where n is 10} the higher voltage source Vdd voltage, the detection output unit 3 outputs the detection output signal Sout1 of the higher voltage source Vdd voltage to the detection output terminal Pad2. When a short-to-power is detected by the voltage detection circuit 90 [when the voltage applied to the detection terminal Pad1 is greater than or equal to 1.1 times {1+(1/n), where n is 10} the higher voltage source Vdd voltage], the detection output unit 3 outputs the detection output signal Sout1 of the lower voltage source Vss voltage to the detection output terminal Pad2.

The transistor TR11 is an N-channel MOS transistor. A drain (a first terminal) of the transistor TR11 is connected to the higher voltage source Vdd, a gate (control terminal) of the transistor TR11 is connected to the Node N11, and a source (a second terminal) of the transistor TR11 is connected to a Node N12. One end of the resistor R6 is connected to the Node N12, and the other end of the resistor R6 is connected to the lower voltage source (ground potential) Vss.

One end of the resistor R7 is connected to the higher voltage source Vdd, and the other end of the resistor R7 is connected to a Node N13. The transistor TR12 is an NPN transistor. A collector (a first terminal) of the transistor TR12 is connected to the Node N13, a base (control terminal) of the transistor TR12 is connected to the Node N12, and an emitter (a second terminal) of the transistor TR12 is connected to the lower voltage source (ground potential) Vss. The detection output signal Sout1 is outputted from the drain side (the Node N13) of the transistor TR12.

As illustrated in FIG. 2, a voltage detection circuit 100 of a comparative example includes a power source 5, a comparator 6, a resistor Ra, a resistor Rb, a diode Da, the detection terminal Pad1, and the detection output terminal Pad2. A power source line for supplying the higher voltage source Vcc is provided in the vicinity of the voltage detection circuit 100.

One end of the resistor Ra is connected to the detection terminal Pad1, and the other end of the resistor Ra is connected to a Node Na. One end of the resistor Rb is connected to the Node Na, and the other end of the resistor Rb is connected to the lower voltage source (ground potential) Vss. The resistors Ra and Rb serve as a resistance dividing circuit, and output a voltage resistance-divided by the Node Na. The voltage at the Node Na changes in accordance with the voltage at the detection terminal Pad1.

A cathode of the diode Da is connected to the Node Na, and an anode of the diode Da is connected to the lower voltage source (ground potential) Vss. The diode Da prevents the Node Na from reaching to a predetermined voltage or higher (i.e., serves as a diode clamping circuit) so that a high voltage is not applied to the comparator 6 when a short-to-power occurs in the voltage detection circuit 100 (for example, when the detection terminal Pad1 reaches the higher voltage source Vcc).

The power source 5 is provided between the (−) port on the input side of the comparator 6, and the lower voltage source (ground potential) Vss, and generates a reference voltage Vref.

The comparator 6 as a detection comparator is provided between the higher voltage source Vdd and the lower voltage source (ground potential) Vss. The (+) port on the input side of the comparator 6 is connected to the Node Na, and the reference voltage Vref is inputted to the (−) port on the input side of the comparator 6, and then a signal obtained by comparing and amplifying the inputs is outputted to the detection output terminal Pad2 as the detection output signal Sout1.

When the detection terminal Pad1 is less than a predetermined voltage, the comparator 6 outputs the detection output signal Sout1 which has been made by the comparison and amplification, while when a short-to-power occurs in the voltage detection circuit 100 and the detection terminal Pad1 reaches a predetermined voltage or higher, the comparator 6 outputs the detection output signal Sout1 of the lower voltage source (ground potential) Vss.

Therefore, in the voltage detection circuit 100 of the comparative example, the detection terminal input current that flows from the detection terminal Pad1 to the resistor Ra is increased along with an increase in the voltage at the detection terminal Pad1 due to a short-to-power. For example, in the case where the higher voltage source Vcc is 40V, a current of several tens µA flows as a detection terminal input current. Furthermore, when the diode Da, which is a diode clamping circuit, starts to function, the detection terminal input current is further increased.

Figure 3:
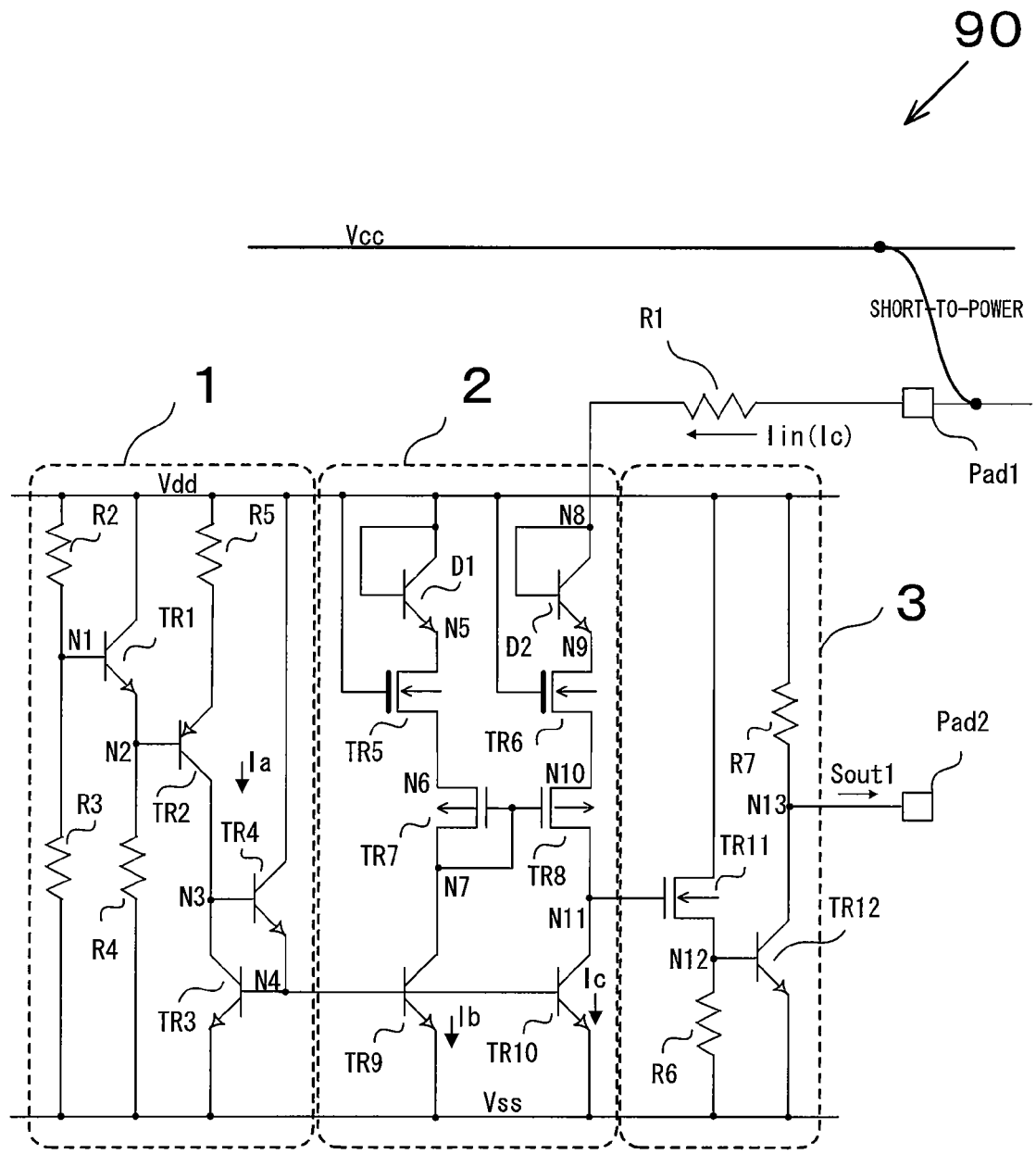
FIG. 3 is a diagram illustrating the case where a short-to-power occurs in the voltage detection circuit according to the first embodiment.

Next, the case where a line connected to the detection terminal has a short-to-power is described with reference to FIGS. 3 to 6. FIG. 3 is a diagram illustrating the case where a short-to-power occurs in the voltage detection circuit. As illustrated in FIG. 3, when the detection terminal Pad1 is made contact with the higher voltage source Vcc in the voltage detection circuit 90, a short-to-power occurs in the voltage detection circuit 90 because the relationship between the higher voltage source Vcc and the higher voltage source Vdd is set as follows:

$$Vcc >> Vdd \qquad \text{Expression (1)}$$

Here, for example, the higher voltage source Vdd is set to 5V, and the higher voltage source Vcc is set to 40V (battery pack).

When a short-to-power occurs in the voltage detection circuit 90, a detection terminal input current Iin starts to flow from the detection terminal Pad1 to the resistor R1. When the transistor TR6 is turned on, the current mirror circuit constituted by the transistors TR3 and TR10 operates, and the detection terminal input current Iin becomes the current Ic level.

Figure 4:
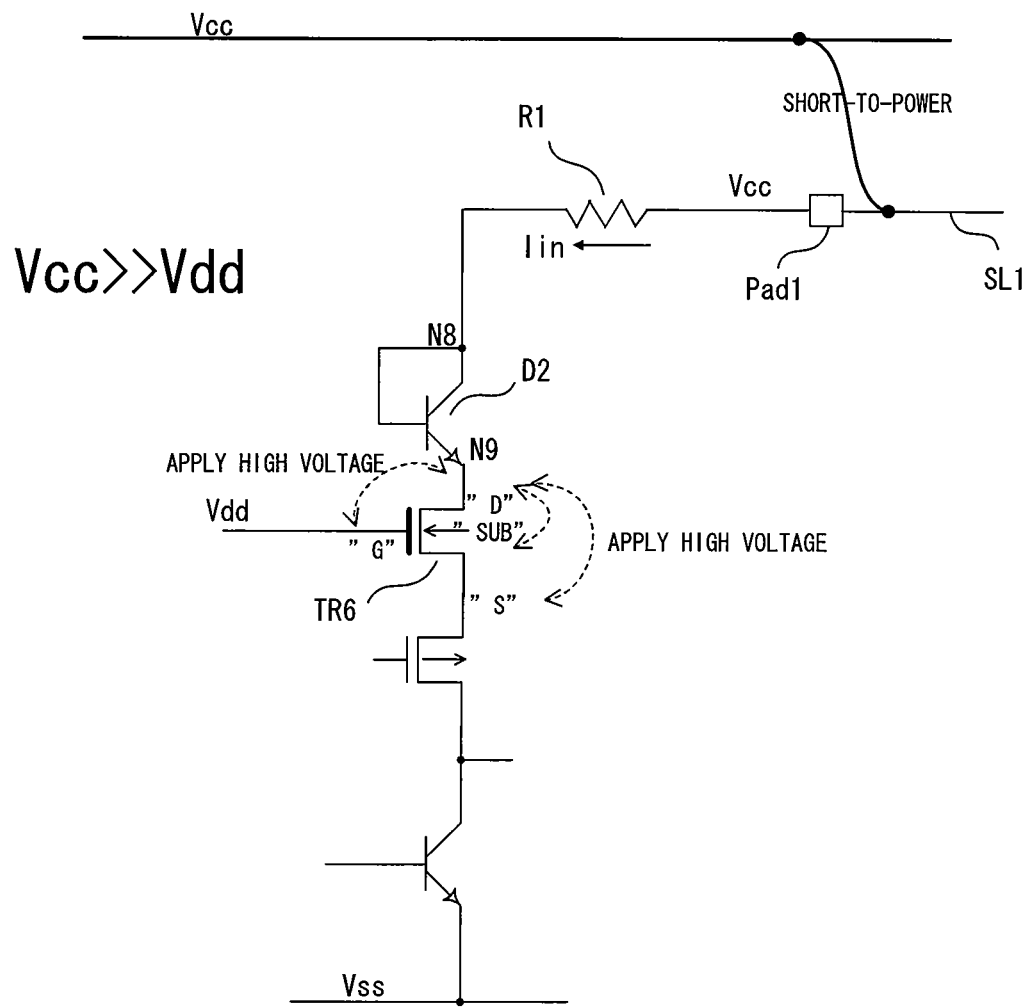
FIG. 4 is a diagram illustrating the manner in which a high voltage is applied to a transistor of the voltage detection circuit according to the first embodiment.

FIG. 4 is a diagram illustrating the manner in which a high voltage is applied to a transistor of the voltage detection circuit. As illustrated in FIG. 4, when a short-to-power occurs in the voltage detection circuit 90, one end of the resistor R1 reaches the higher voltage source Vcc voltage, and a high voltage is applied to the Node N9 (drain of the transistor TR6) via the resistor R1 and the diode D2. At this moment, in the transistor TR6, a high voltage is applied between the drain and the substrate, between the drain and the source, and between the drain and the gate.

However, because an N-channel high-voltage MOS transistor is used as the transistor TR6, even when a high voltage is applied to the drain, deterioration of characteristics and an occurrence of breakage can be prevented.

In the case of Pb (lead) battery, the higher voltage source Vcc is 12V, and in the case of battery pack with multi stage cells, the higher voltage source Vcc may be 144V. In either case, by using a high-voltage MOS transistor with high voltage resistance as the transistor TR6, the high-voltage MOS transistor being resistant to the higher voltage source Vcc or higher, deterioration of characteristics and an occurrence of breakage in the transistor TR6 can be prevented.

Figure 5:
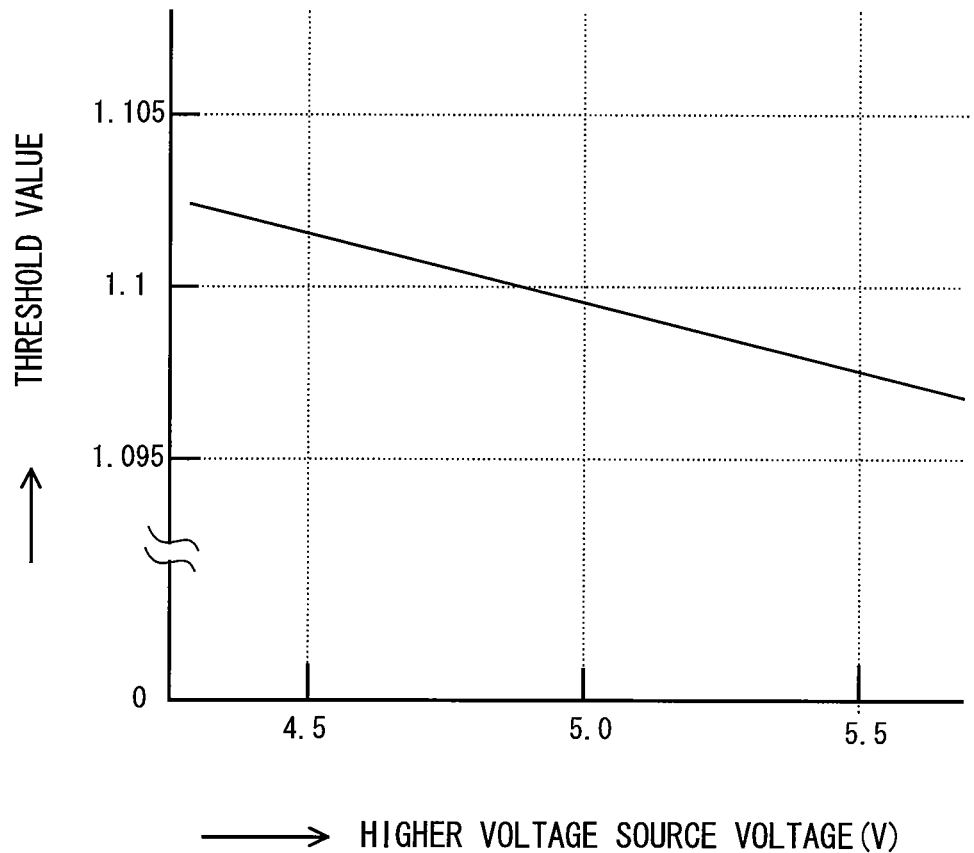
FIG. 5 is a graph illustrating the relationship between power source voltage and threshold value according to the first embodiment.

FIG. 5 is a graph illustrating the relationship between power source voltage and threshold value. For example, in the case where the higher voltage source Vdd voltage is 5V as illustrated in FIG. 5, even when the higher voltage source Vdd supplied to the voltage detection circuit 90 varies in a range of ±10%, the change in the threshold value is extremely small, and thus the threshold value is set to approximately 1.1 times the higher voltage source Vdd. This setting is made in order to set the detection output voltage Vout1 outputted from the detection output terminal Pad2 to the lower voltage source (ground potential) Vss level when a short-to-power occurs and a voltage more than or equal to a threshold voltage (5.5V) is applied to the detection terminal Pad1. When a short-topower occurs, 10% of the higher voltage source Vdd voltage is applied across both ends of the resistor R1.

Figure 6:
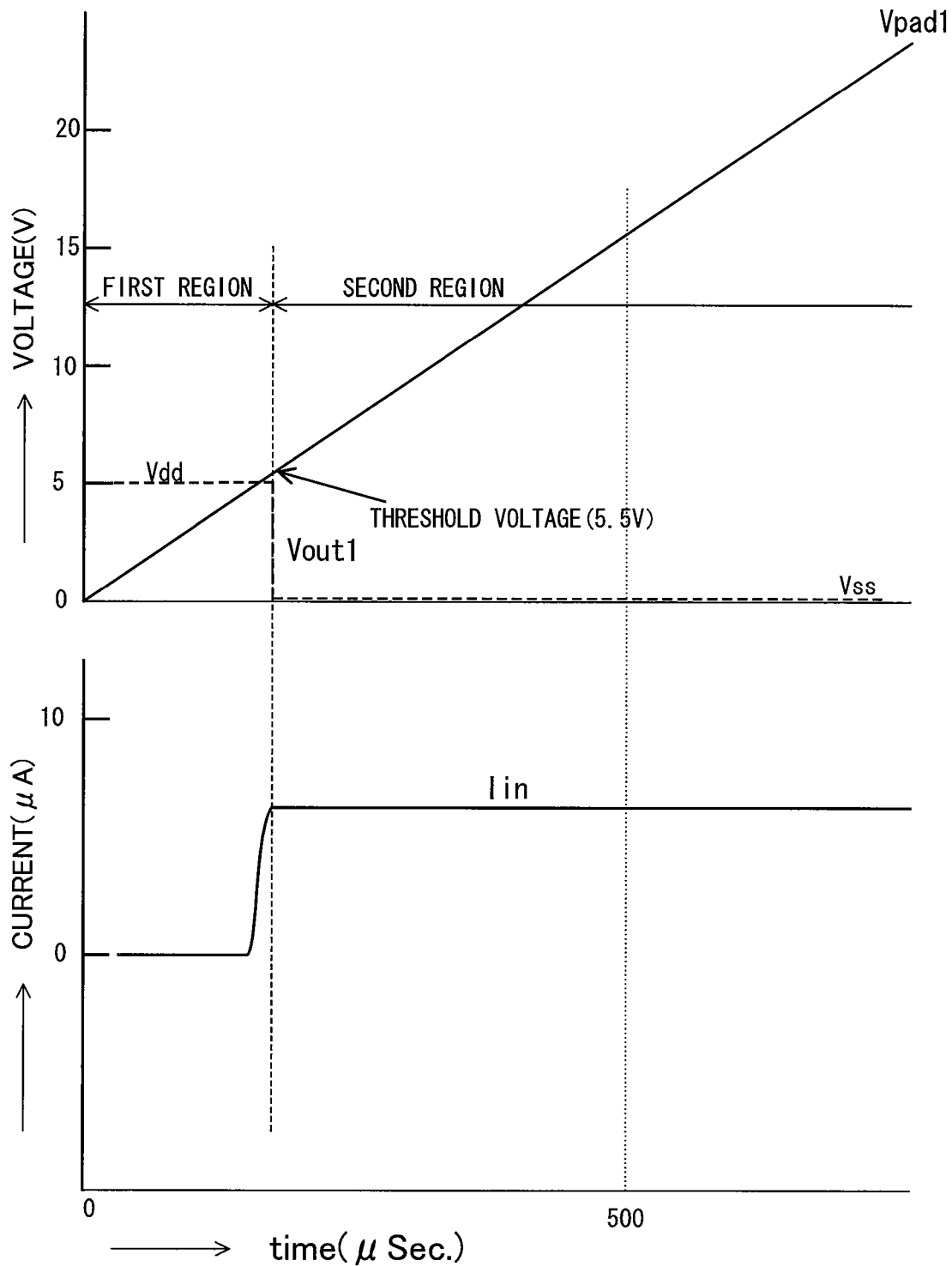
FIG. 6 is a graph illustrating a characteristics change in relation to a detected terminal voltage according to the first embodiment.

FIG. 6 is a graph illustrating a characteristics change in relation to a detected terminal voltage. FIG. 6 shows a characteristic diagram in the case where a detection terminal voltage Vpad1, which is linearly increased, is applied to the detection terminal Pad1. A first region in the diagram is a normal operation region. A second region in the diagram is an operation region when a short-to-power occurs.

As illustrated in FIG. 6, the detection terminal voltage Vpad1 is reverse-biased in the first region as a low voltage region, and thus the detection terminal input current Iin does not flow. That is to say, in the first region where the detection output terminal Vpad1 is less than 1.1 times the higher voltage source Vdd (threshold value 5.5V), the transistors TR11, TR12 of the detection output unit 3 are off, and the detection output voltage Vout1 outputted as the detection output signal Sout1 is the higher voltage source Vdd voltage (5V). When the detection terminal voltage Vpad1 increases and approaches the threshold voltage (5.5V), the detection terminal input current Iin starts to flow.

The reference voltage Vref between the higher voltage source Vdd and the Node N7 in the detection unit 2, and current I(TR5) are expressed as follows:

$$Vref = Vf(D1) + \{Ron(TR5) \times I(TR5)\} + Vth(TR7) \quad \text{Expression (2)}$$

$$I(TR5) = [Vdd \times \{r2/(r2+r3)\}]/r5 \quad \text{Expression (3)}$$

Here, Vf(D1) is the forward voltage of the diode D1, Ron (TR5) is the on-resistance of the transistor TR5, I(TR5) is the current which flows to the transistor TR5, Vth(TR7) is the threshold voltage of the transistor TR7, r2 is the resistance of resistor R2, r3 is the resistance of resistor R3, and r5 is the resistance of resistor R5.

When a voltage difference Vdn7 between the higher voltage source Vdd and the Node N7 in the detection unit 2 approaches the reference voltage Vref, the detection terminal input current Iin starts to flow.

The potential difference Vpn11 between the detection terminal Pad1 and the Node N11 when a current I1 which is, for example, (1/2) of the current Ic flows to the diode D2 with a grounded base is expressed as:

$$Vpn11 = Vf(D2) + \{(Ron(TR6) \times I1)/2\} + Vth(TR8) + \{(r1 \times I1)/2\} \quad \text{Expression (4)}$$

For example, in the case where the higher voltage source Vcc is set to 40V, the higher voltage source Vdd is set to 5V, and the threshold voltage for short-to-power determination is set to 5.5V, when the current flowing to the diode D2 with a grounded base becomes (1/2) of the current Ic, the forward voltage Vf is reduced by 18 mV. Therefore, when the detection terminal voltage Vpad1 is 40 mV lower than the threshold value (5.5V), the current I1, which is the detection terminal input current Iin, has a flow of (1/2) of the current Ic.

When the detection terminal voltage Vpad1 reaches 1.1 times the higher voltage source Vdd (threshold voltage 5.5V), the transistor TR6 is turned on, the current mirror circuit constituted by the transistors TR3 and TR10 operates, and the detection output voltage Vout1 outputted as the detection output signal Sout1 from the detection output unit 3 becomes the lower voltage source (ground potential) Vss voltage.

When the detection terminal voltage Vpad1 reaches 1.1 times the higher voltage source Vdd (threshold voltage 5.5V) or higher, a constant voltage which is 10% of the higher voltage source Vdd is applied across both ends of the resistor R1 by the operation of the threshold value generation unit 1 and the detection unit 2 because the resistors R5 and R1 are set to the same resistance. Therefore, in the second region where the detection terminal voltage Vpad1 is greater than or equal to 1.1 times the higher voltage source Vdd (threshold voltage 5.5V), the detection terminal input current Iin with a constant current value flows, the transistor TR11 of the detection output unit 3 is turned on, the voltage at the Node N12 is increased higher than the lower voltage source (ground potential) Vss, and the transistor TR12 is turned on, and thus the detection output voltage Vout1 outputted as the detection output signal Sout1 becomes the lower voltage source (ground potential) Vss voltage. As the constant current value, the detection terminal input current Iin of 7 μA flows, for example. The value is a significantly small compared with the comparative example.

The current value (7 μA) of the detection terminal input current Iin in the second region can be significantly reduced below the current value of the detection terminal input current Iin which flows to the voltage detection circuit 100 of the comparative example. In the voltage detection circuit 100 of the comparative example, the high-voltage value which is applied in the case where a short-to-power occurs needs to be considered each time of the occurrence. Consequently, in the voltage detection circuit 100 of the comparative example, the design of the devices, including the comparator 6, to which a high voltage is applied needs to be redesigned.

In the voltage detection circuit 90 of the embodiment, the redesign is unnecessary. In addition, in the voltage detection circuit 90 of the embodiment, the resistors R5 and R1 are set to the same appropriate resistance, and thus the voltage of $\{1+(1/n)\}$ times the higher voltage source Vdd voltage can be set as a fixed threshold value. The threshold setting does not need to be readjusted regardless of a high voltage value when a short-to-power occurs.

As described above, in the voltage detection circuit, the ECU, and an automobile including the ECU of the embodiment, the automobile 200 includes tire 21, the engine 22, the power source 23, the ECU 24, the sensors 31 to 34, the switch 35, the motor 36, the motor 37, the mirror 38, and the mirror 39. The ECU 24 includes the regulator 51, the driver 52, and the MCU 53. The driver 52 includes the threshold value generation unit 1, the detection unit 2, the detection output unit 3, the resistor R1, the detection terminal Pad1, and the detection output terminal Pad2. The threshold value generation unit 1 includes the transistors TM to TR4, and the resistors R2 to R5. The detection unit 2 includes the transistors TR5 to TR10, the diode D1, and the diode D2. The detection unit 2 sets the voltage between both ends of the resistor R1 to the same value as the setting voltage between both ends of the resistor R2 when a short-to-power occurs Therefore, the detection terminal input current Iin which is generated at an occurrence of a short-to-power can be significantly reduced. The detection terminal input current Iin can be set to a constant value regardless of a high voltage which is applied when a short-to-power occurs. In addition, deterioration and breakage of internal devices due to a high voltage at an occurrence of a short-to-power can be prevented, the internal devices constituting the voltage detection circuit 90. Consequently, redesigning of the devices in consideration of a short-to-power is unnecessary. The threshold setting does not need to be readjusted regardless of a high voltage value at an occurrence of a short-to-power. Furthermore, the output drive unit 61 is stopped at an occurrence of a short-to-power, deterioration and breakage of the driver 52 can be prevented, and thus the ECU 24 with high reliability can be provided. Furthermore, the target controlled unit 42 controlled by the ECU 24 stops the operation at an occurrence of a short-to-power, and thus deterioration and breakage of the target controlled unit 42 can be prevented, and high reliability of the automobile 200 provided with the ECU can be achieved.

In the embodiment, the threshold value generation unit 1 is composed of bipolar transistors, the detection unit 2 and the detection output unit 3 are composed of BiCMOS. However, the invention is not necessarily limited to the above case. For example, the threshold value generation unit 1, the detection unit 2, and the detection output unit 3 may be formed of CMOS (the transistors TR5 and TR6 which are high-voltage MOS transistors are excluded).

In the embodiment, the voltage detection circuit 90 is used as an in-vehicle voltage detection circuit of the driver 52. However, the invention is not necessarily limited to the above case. In the case of application to a voltage detection circuit of an output driver for industrial or consumer products, the voltage detection circuit 90 is provided adjacent to a plurality of high voltage source lines, for example.

Figure 7:
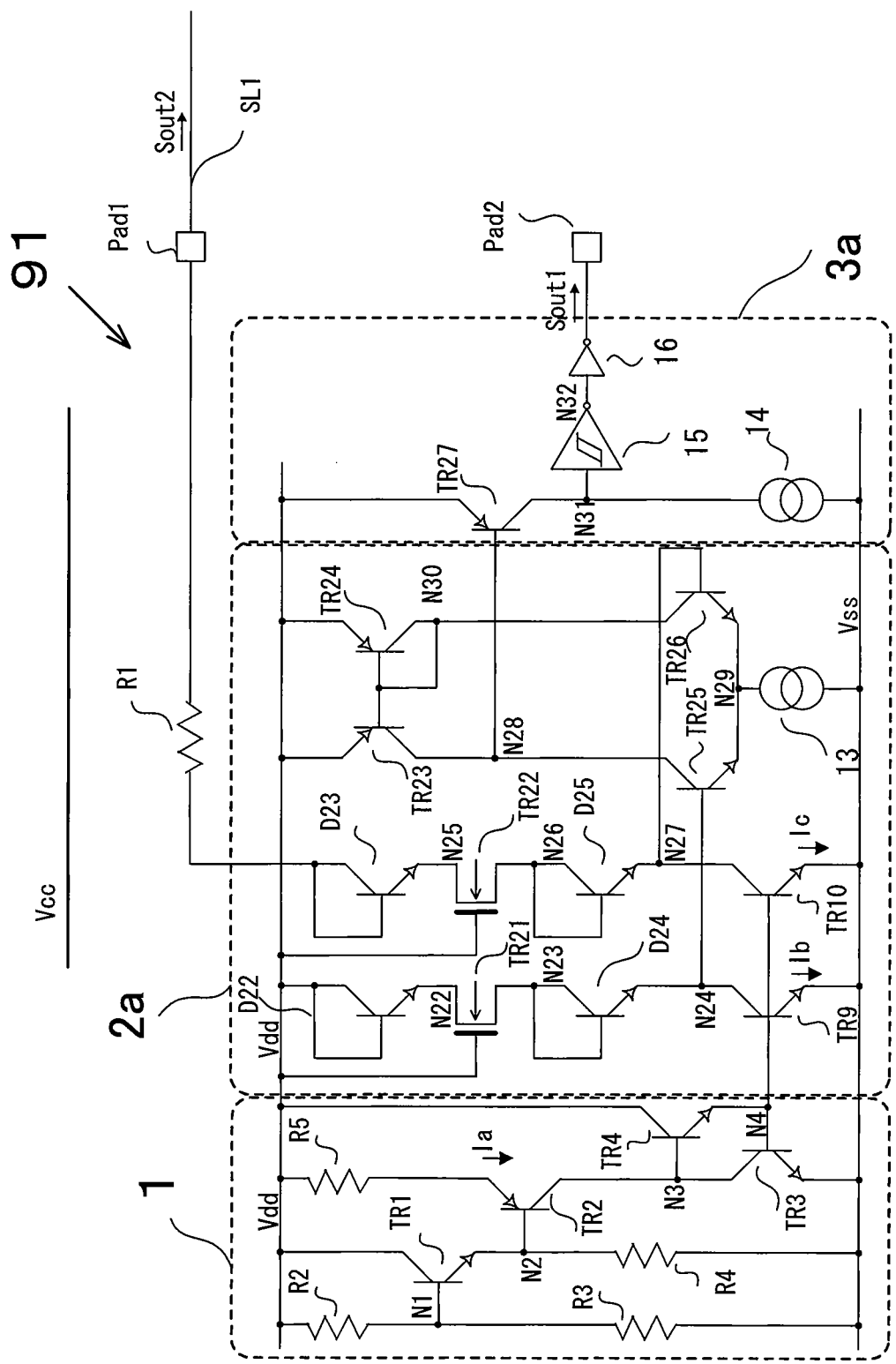
FIG. 7 is a circuit diagram illustrating the configuration of a voltage detection circuit according to a second embodiment.

A voltage detection circuit, an ECU, and an automobile including the ECU according to a second embodiment will be described with reference to the drawings. FIG. 7 is a circuit diagram illustrating the configuration of the voltage detection circuit. In the embodiment, the configuration of a detection unit and a detection output unit is changed.

Hereinafter, the same components as those in the first embodiment are labeled with the same reference symbols and description is omitted, and only different components are described.

As illustrated in FIG. 7, a voltage detection circuit 91 includes the threshold value generation unit 1, a detection unit 2a, a detection output unit 3a, the resistor R1, the detection terminal Pad1, and the detection output terminal Pad2. A power source line for supplying the higher voltage source Vcc is provided in the vicinity of the voltage detection circuit 91. Similarly to the first embodiment, the voltage detection circuit 91 is provided in a driver of the ECU which electronically controls the automobile. The voltage detection circuit 91 operates in a similar manner to the voltage detection circuit 90 of the first embodiment, and is used as a voltage detection circuit for a short-to-power of a battery and the like.

The detection unit 2a includes a current source 13, the transistor TR9, the transistor TR10, transistors TR21 to TR26 and diodes D22 to D25. The detection unit 2a operates in a similar manner to the detection unit 2 in the first embodiment. The detection unit 2a sets the voltage between both ends of the resistor R1 to the same value as the setting voltage between both ends of the resistor R2 when a short-to-power occurs (when the detection terminal Pad1 is in contact with the higher voltage source Vcc).

The diode D22 includes an NPN transistor having a base connected to the collector. The diode D22 is provided between the higher voltage source Vdd and a Node N22. The diode D23 includes an NPN transistor having a base connected to the collector. The diode D23 is provided between the resistor R1 and a Node N25.

Transistor TR21 is an N-channel high-voltage MOS transistor. A drain (a first terminal) of the transistor TR21 is connected to the Node N22, a gate (control terminal) of the transistor TR21 is connected to the higher voltage source Vdd, and a source (a second terminal) of the transistor TR21 is connected to a Node N23. The transistor TR21 is turned on when the higher voltage source Vdd is supplied to the transistor TR21.

Transistor TR22 is an N-channel high-voltage MOS transistor. A drain (a first terminal) of the transistor TR22 is connected to the Node N25, a gate (control terminal) of the transistor TR22 is connected to the higher voltage source Vdd, and a source (a second terminal) of the transistor TR22 is connected to a Node N26. The higher voltage source Vdd is supplied to the transistor TR22, and the transistor TR22 is turned on when the voltage at the detection terminal Pad1 reaches a predetermined voltage or higher.

The diode D24 includes an NPN transistor having a base connected to the collector. The diode D24 is provided between the Node N23, and a Node N24, the collector (the first terminal) of the transistor TR9. The diode D25 includes an NPN transistor having a base connected to the collector. The diode D25 is provided between the Node N26, and a Node N27, the collector (the first terminal) of the transistor TR10.

Similarly to the first embodiment, the transistor TR9 allows the current Ib to flow to the lower voltage source (ground potential) Vss side. Similarly to the first embodiment, the transistor TR10 allows the current Ic to flow to the lower voltage source (ground potential) Vss side.

The current source 13, the transistors TR23 to TR26 constitute a comparator. The comparator compares the voltage at the Node N24 with the voltage at the Node N27, and outputs a signal from the Node N28, the signal being obtained by comparing and amplifying the voltages.

The transistor TR23 is a PNP transistor. An emitter (a first terminal) of the transistor TR23 is connected to the higher voltage source Vdd, a base (control terminal) of the transistor TR23 is connected to a Node N30, and a collector (a second terminal) of the transistor TR23 is connected to the Node N28. The transistor TR24 is a PNP transistor. An emitter (a first terminal) of the transistor TR24 is connected to the higher voltage source Vdd, a base (control terminal) of the transistor TR24 is connected to the base (control terminal) and the collector (the second terminal) of the transistor TR23, and the Node N30. The transistors TR23 and TR24 constitute a current mirror circuit and serve as a load to the comparator.

The transistor TR25 is an NPN transistor. A collector (a first terminal) of the transistor TR25 is connected to Node N28, a base (control terminal) of the transistor TR25 is connected to the Node N24, and an emitter (a second terminal) of the transistor TR25 is connected to a Node N29. The transistor TR26 is an NPN transistor. A collector (a first terminal) of the transistor TR26 is connected to the Node N30, a base (control terminal) of the transistor TR26 is connected to the Node N27, and an emitter (a second terminal) of the transistor TR26 is connected to the Node N29. The transistors TR25 and TR26 make a differential pair.

One end of the current source 13 is connected to the Node N29, and the other end of the current source 13 is connected to the lower voltage source (ground potential) Vss. The current source 13 causes a current to flow to the lower voltage source (ground potential) Vss side.

When the voltage at the Node N24 is larger than the voltage at the Node N27 (the first region in FIG. 6), the comparator constituted by the current source 13, and the transistors TR23 to TR26 outputs a "Low" level signal from the Node N28. When the voltage at the Node N24 is less than the voltage at the Node N27 (the second region in FIG. 6), the comparator outputs a "High" level signal from the Node N28.

The detection output unit 3a includes a current source 14, a hysteresis comparator 15, an inverter 16, and a transistor TR27. Similarly to the first embodiment, when the voltage applied to the detection terminal Pad1 is less than {1+(1/n)} times the higher voltage source Vdd voltage, the detect output unit 3a outputs the detection output signal Sout1 of the higher voltage source Vdd voltage to the detection output terminal Pad2. Similarly to the first embodiment, when voltage detection circuit 91 detects a short-to-power [when the voltage applied to the detection terminal Pad1 is greater than or equal to {1+(1/n)} times the higher voltage source Vdd voltage], the detect output unit 3a outputs the detection output signal Sout1 of the lower voltage source Vss voltage to the detection output terminal Pad2.

The transistor TR27 is a PNP transistor. An emitter (a first terminal) of the transistor TR27 is connected to the higher voltage source Vdd, a base (control terminal) of the transistor TR27 is connected to the Node N28, and a collector (a second terminal) of the transistor TR27 is connected to a Node N31.

One end of the current source 14 is connected to the Node N31, and the other end of the current source 14 is connected to the lower voltage source (ground potential) Vss. The current source 14 causes a current to flow to the lower voltage source (ground potential) Vss side.

The input side of the hysteresis comparator 15 is connected to the Node N31, and the output side of the hysteresis comparator 15 is connected to a Node N32. The input side of the inverter 16 is connected to the Node N32, and the output side of the inverter 16 is connected to the detection output terminal Pad2.

According to the second embodiment, the voltage detection circuit includes a threshold value generation unit similarly configured as in the first embodiment, and compares the voltage at the Node N24 based on the threshold setting with the voltage at the Node N27 based on the terminal voltage at the detection terminal Pad1, and then based on a result of the comparison, outputs the detection output signal Sout1 in accordance with the voltage at Node N28 to the detection output terminal Pad2.

When the voltage at the Node N24 is greater than the voltage at the Node N27, and the Node N28 is at a "Low" level (the first region in FIG. 6), the transistor TR27 is turned on, and the voltage at the Node N31 is increased higher than the lower voltage source (ground potential) Vss. The Node N32 on the output side of the hysteresis comparator 15 is then set to a "Low" level, and a signal at the low level is inverted by the inverter 16, and the detection output voltage Vout1 which is the detection output signal Sout1 is set to the higher voltage source Vdd voltage.

When the voltage at the Node N27 is greater than the voltage at the Node N24, and the Node N28 is at a "High" level (the second region in FIG. 6), the transistor TR27 is turned off, and the voltage at the Node N31 is set to the lower voltage source (ground potential) Vss level. The Node N32 on the output side of the hysteresis comparator 15 is then set to a "High" level, and a signal at the high level is inverted by the inverter 16, and the detection output voltage Vout1 which is the detection output signal Sout1 is set to the lower voltage source (ground potential) Vss.

Thus, the voltage detection circuit 91 in the second embodiment detects a short-to-power, and when the voltage applied to the detection terminal Pad1 is greater than or equal to {1+(1/n)} times the higher voltage source Vdd voltage, the voltage detection circuit 91 can significantly reduce the value of the detection terminal input current Iin similarly to the voltage detection circuit 90 of the first embodiment. In the voltage detection circuit 91 of the embodiment, redesigning of the relevant devices is unnecessary. The voltage of {1+(1/n)} times the higher voltage source Vdd voltage can be set as a fixed threshold value by the threshold value generation unit 1. The threshold setting does not need to be readjusted regardless of a high voltage value at an occurrence of a short-to-power.

As described above, in the voltage detection circuit, the ECU, and an automobile including the ECU of the embodiment, the driver of the ECU mounted on the automobile includes the threshold value generation unit 1, the detection unit 2a, the detection output unit 3a, the resistor R1, the detection terminal Pad1, and the detection output terminal Pad2. The threshold value generation unit 1 includes the transistors TR1 to TR4, and the resistors R2 to R5. The detection unit 2a includes the current source 13, the transistor TR9, the transistor TR10, the transistors TR21 to TR26 and the diodes D22 to D25. The detection unit 2a sets the voltage between both ends of the resistor R1 to the same value as the setting voltage between both ends of the resistor R2 when a short-to-power occurs.

Therefore, the detection terminal input current Iin which is generated at an occurrence of a short-to-power can be significantly reduced. The detection terminal input current Iin can be set to a constant value regardless of a high voltage which is applied when a short-to-power occurs. In addition, deterioration and breakage of internal devices due to a high voltage at an occurrence of a short-to-power can be prevented, the internal devices constituting the voltage detection circuit 91. Consequently, redesigning of the devices in consideration of a short-to-power is unnecessary. The threshold setting does not need to be readjusted regardless of a high voltage value at an occurrence of a short-to-power. Furthermore, breakage of the driver can be prevented regardless of the value of the higher voltage source voltage which is applied at an occurrence of a short-to-power, and thus the ECU 24 with high reliability can be provided. In addition, deterioration and breakage of a target controlled unit which is controlled by the ECU can be prevented, and thus high reliability of an automobile provided with the ECU can be achieved.

In the embodiment, the comparator is formed of bipolar transistors. However, the invention is not necessarily limited to the above case. The comparator may be formed of CMOS or BiCMOS, for example.

Figure 8:
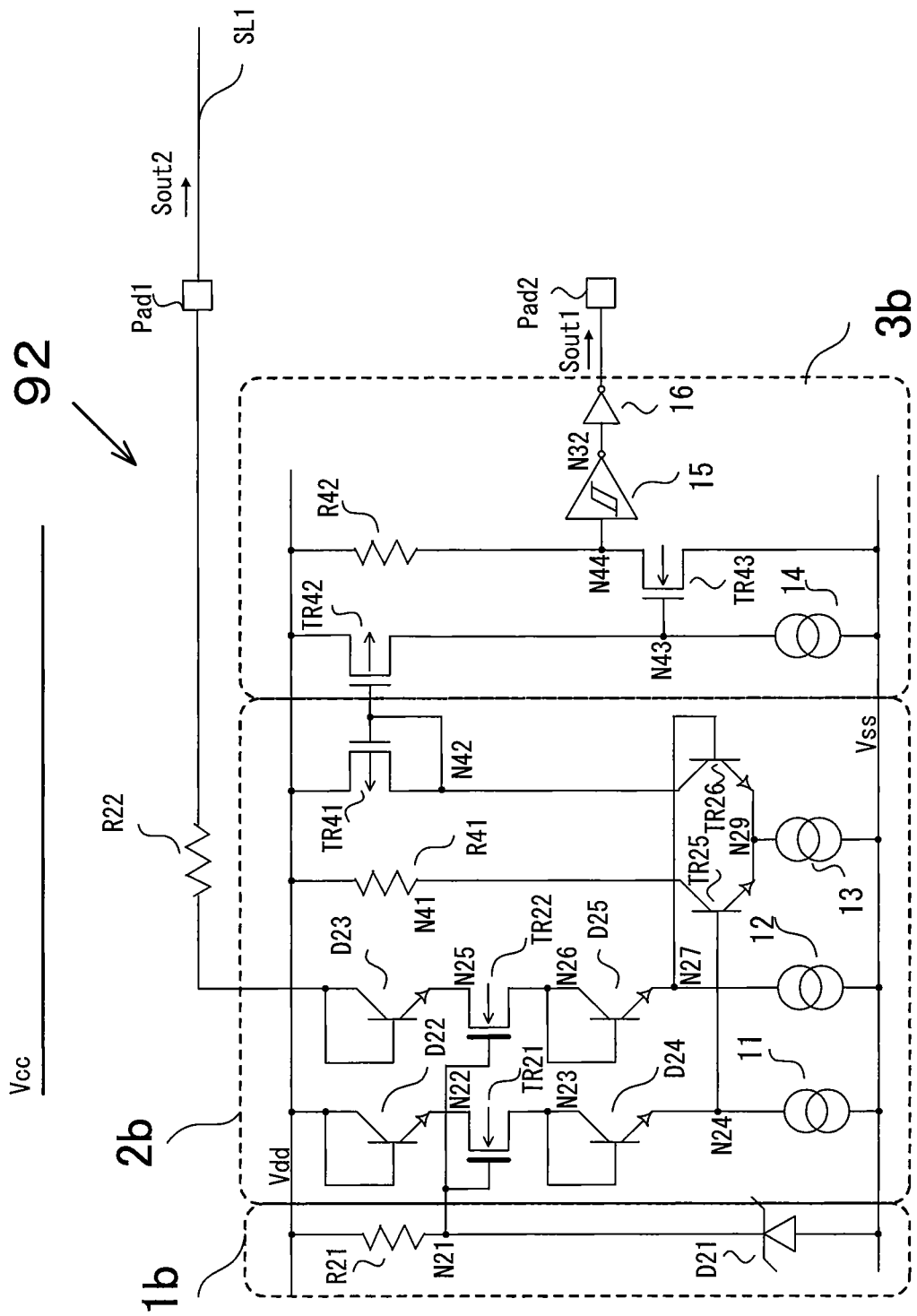
FIG. 8 is a circuit diagram illustrating the configuration of a voltage detection circuit according to a third embodiment.

A voltage detection circuit, an ECU, and an automobile including the ECU according to a third embodiment will be described with reference to the drawings. FIG. 8 is a circuit diagram illustrating the configuration of the voltage detection circuit. In the embodiment, a setting voltage is set by the threshold value generation unit.

As illustrated in FIG. 8, the voltage detection circuit 92 includes a threshold value generation unit 1b, a detection unit 2b, a detection output unit 3b, a resistor R22, the detection terminal Pad1, and the detection output terminal Pad2. Similarly to the first embodiment, the voltage detection circuit 92 is provided in a driver of the ECU which electronically controls the automobile. A power source line for supplying the higher voltage source Vcc is provided in the vicinity of the voltage detection circuit 92. The voltage detection circuit 92 operates in a similar manner to the voltage detection circuit 90 in the first embodiment. The voltage detection circuit 92 is used as a voltage detection circuit for a short-to-power of a battery and the like.

The threshold value generation unit 1b includes the resistor R21 and a diode D21. The threshold value generation unit 1b generates the setting voltage between both ends of the resistor R21, the setting voltage being (1/n) the voltage of the higher voltage source Vdd.

One end of the resistor R21 is connected to the higher voltage source Vdd, and the other end of the resistor R21 is connected to the Node N21. A cathode of the diode D21 is connected to the Node N21, and an anode of the diode D21 is connected to the lower voltage source (ground potential) Vss.

One end of the resistor R22 is connected to the detection terminal Pad1, and the other end of the resistor R22 is connected to the diode D23 of the detection unit 2b. The setting voltage which is (1/n) of the higher voltage source Vdd is set between both ends of the resistor R22.

The detection unit 2b includes the current sources 11 to 13, the transistor TR21, the transistor TR22, the transistor TR25, the transistor TR26, a transistor TR41, a resistor R41 and the diode D22 to D25. The detection unit 2b sets the voltage between both ends of the resistor R22 to the same value as the setting voltage between both ends of the resistor R21 when a short-to-power occurs.

The diode D25 includes an NPN transistor having a base connected to the collector. The diode D22 is provided between the higher voltage source Vdd and the Node N22. The diode D23 includes an NPN transistor having a base connected to the collector. The diode D23 is provided between the resistor R22 and the Node N25.

Transistor TR21 is an N-channel high-voltage MOS transistor. A drain (a first terminal) of the transistor TR21 is connected to the Node N22, a gate (control terminal) of the transistor TR21 is connected to the Node N21, and a source (a second terminal) of the transistor TR21 is connected to the Node N23. The transistor TR21 is turned on when the higher voltage source Vdd is supplied to the transistor TR21.

Transistor TR22 is an N-channel high-voltage MOS transistor. A drain (a first terminal) of the transistor TR22 is connected to the Node N25, a gate (control terminal) of the transistor TR22 is connected to the Node N21, and a source (a second terminal) of the transistor TR22 is connected to the Node N26. The higher voltage source Vdd is supplied to the transistor TR22, and the transistor TR22 is turned on when the voltage at the detection terminal Pad1 reaches a predetermined voltage or higher.

The diode D24 includes an NPN transistor having a base connected to the collector. The diode D24 is provided between the Node N23 and the Node N24. The diode D25 includes an NPN transistor having a base connected to the collector. The diode D25 is provided between the Node N26 and the Node N27.

One end of the current source 11 is connected to the Node N24, and the other end of the current source 11 is connected to the lower voltage source (ground potential) Vss. The current source 11 causes a current to flow to the lower voltage source (ground potential) Vss side. One end of the current source 12 is connected to the Node N27, and the other end of the current source 12 is connected to the lower voltage source (ground potential) Vss. The current source 12 causes a current to flow to the lower voltage source (ground potential) Vss side.

The current source 13, the transistor TR25, the transistor TR26, the transistor TR41, and the resistor R41 constitute a comparator. The comparator compares the voltage at the Node N24 with the voltage at the Node N27, and outputs a signal obtained by comparing and amplifying the voltages from the Node N42.

One end of the resistor R41 is connected to the higher voltage source Vdd, and the other end of the resistor R41 is connected to the Node N41 and the collector (the first terminal) of the transistor TR25. The resistance R41 serves as a load.

Transistor TR41 is a P-channel MOS transistor. A source (a first terminal) of the transistor TR41 is connected to the higher voltage source Vdd, a gate (control terminal) of the transistor TR41 is connected to a drain (a second terminal) of the transistor TR41, the Node N42, and the drain (the first terminal) of transistor TR26.

The transistor TR25 is an NPN transistor. A collector (a first terminal) of the transistor TR25 is connected to the Node N41, a base (control terminal) of the transistor TR25 is connected to the Node N24, and an emitter (a second terminal) of the transistor TR25 is connected to the Node N29. The transistor TR26 is an NPN transistor. A collector (a first terminal) of the transistor TR26 is connected to the Node N42, a base (control terminal) of the transistor TR26 is connected to the Node N27, and an emitter (a second terminal) of the transistor TR26 is connected to the Node N29. The transistors TR25 and TR26 make a differential pair.

One end of the current source 13 is connected to the Node N29, and the other end of the current source 13 is connected to the lower voltage source (ground potential) Vss. The current source 13 causes a current to flow to the lower voltage source (ground potential) Vss side.

When the voltage at the Node N24 is greater than the voltage at the Node N27 (the first region in FIG. 6), the Node N42 is set to a "High" level. When the voltage at the Node N24 is less than the voltage at the Node N27 (the second region in FIG. 6), the Node N42 is set to a "Low" level.

The detection output unit 3b includes the current source 14, the hysteresis comparator 15, the inverter 16, a transistor TR42, a transistor TR43, and a resistor R42. Similarly to the first and second embodiments, when the voltage applied to the detection terminal Pad1 is less than {1+(1/n)} times the higher voltage source Vdd voltage, the detect output unit 3b outputs the detection output signal Sout1 of the higher voltage source Vdd voltage to the detection output terminal Pad2. Similarly to the first and second embodiments, when voltage detection circuit 92 detects a short-to-power [when the voltage applied to the detection terminal Pad1 is greater than or equal to {1+(1/n)} times the higher voltage source Vdd voltage], the detect output unit 3b outputs the detection output signal Sout1 of the lower voltage source Vss voltage to the detection output terminal Pad2.

Transistor TR42 is a P-channel MOS transistor. A source (a first terminal) of the transistor TR42 is connected to the higher voltage source Vdd, a gate (control terminal) of the transistor TR42 is connected to the gate (control terminal) of the transistor TR41 and the Node N42, and a drain (a first terminal) of the transistor TR42 is connected to a Node N43. The transistors TR42 and TR41 constitute a current mirror circuit.

One end of the current source 14 is connected to the Node N42, and the other end of the current source 14 is connected to the lower voltage source (ground potential) Vss. The current source 14 causes a current to flow to the lower voltage source (ground potential) Vss side.

One end of the resistor R42 is connected to the higher voltage source Vdd, and the other end of the resistor R42 is connected to a Node N44. Transistor TR43 is an N-channel MOS transistor. A drain (a first terminal) of the transistor TR43 is connected to the Node 44 and the input side of the hysteresis comparator 15, a gate (control terminal) of the transistor TR43 is connected to the Node N43, and a source (the second terminal) of the transistor TR43 is connected to the lower voltage source (ground potential) Vss.

According to the third embodiment, the voltage detection circuit compares the voltage at the Node N24 based on the threshold setting with the voltage at the Node N27 based on the terminal voltage at the detection terminal Pad1, and then based on a result of the comparison, outputs the detection output signal Sout1 in accordance with the voltage at Node N28 to the detection output terminal Pad2.

When the voltage at the Node N24 is greater than the voltage at the Node N27 and the Node N42 is at a "High" level (the first region in FIG. 6), the Node N43 is set to a "Low" level, the transistor TR43 is off, the Node N44 is set to a "High" level, the Node N32 is set to a "Low" level, and thus the detection output voltage Vout1 which is the detection output signal Sout1 is set to the higher voltage source Vdd.

When the voltage at the Node N27 is greater than the voltage at the Node N24, and the Node N42 is at a "Low" level (the second region in FIG. 6), the Node N43 is set to a "High" level, the transistor TR43 is on, the Node N44 is set to a "Low" level, the Node N32 is set to a "High" level, and thus the detection output voltage Vout1 which is the detection output signal Sout1 is set to the lower voltage source (ground potential) Vss.

Thus, the voltage detection circuit 92 in the third embodiment detects a short-to-power, and when the voltage applied to the detection terminal Pad1 is greater than or equal to $\{1+(1/n)\}$ times the higher voltage source Vdd voltage, the voltage detection circuit 92 can significantly reduce the value of the detection terminal input current Iin similarly to the voltage detection circuit 90 of the first embodiment and the voltage detection circuit 91 of the second embodiment. In the voltage detection circuit 92 of the embodiment, redesigning of the relevant devices is unnecessary. The voltage of $\{1+(1/n)\}$ times the higher voltage source Vdd voltage can be set as a fixed threshold value by the threshold value generation unit 1b. The threshold setting does not need to be readjusted regardless of a high voltage value at an occurrence of a short-to-power.

As described above, in the voltage detection circuit, the ECU, and an automobile including the ECU of the embodiment, the threshold value generation unit 1b, the detection unit 2b, the detection output unit 3b, the resistor R22, the detection terminal Pad1, and the detection output terminal Pad2 are provided. The threshold value generation unit 1b includes the resistor R21 and the diode D21. The detection unit 2b includes the current sources 11 to 13, the transistor TR21, the transistor TR22, the transistor TR25, the transistor TR26, the transistor TR41, the diodes D22 to D25, and the resistor R41. The detection unit 2b sets the voltage between both ends of the resistor R22 to the same value as the setting voltage between both ends of the resistor R21 when a short-to-power occurs.

Therefore, the detection terminal input current Iin which is generated at an occurrence of a short-to-power can be significantly reduced. The detection terminal input current Iin can be set to a constant value regardless of a high voltage which is applied when a short-to-power occurs. In addition, deterioration and breakage of internal devices due to a high voltage at an occurrence of a short-to-power can be prevented, the internal devices constituting the voltage detection circuit 92. Consequently, redesigning of the devices in consideration of a short-to-power is unnecessary. The threshold setting does not need to be readjusted regardless of a high voltage value at an occurrence of a short-to-power. Furthermore, breakage of the driver can be prevented regardless of the value of the higher voltage source voltage which is applied at an occurrence of a short-to-power, and thus the ECU with high reliability can be provided. In addition, deterioration and breakage of a target controlled unit which is controlled by the ECU can be prevented, and thus high reliability of an automobile provided with the ECU can be achieved.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage detection circuit, comprising:
    a threshold value generation unit provided between a higher voltage source and a lower voltage source, and configured to generate a setting voltage equal to one Nth part of a voltage of the higher voltage source and to convert the setting voltage to a first current, wherein N is greater than one;
    a first resistor having one end connected to a detection terminal;
    a detection unit provided between the higher voltage source and the lower voltage source, the detection unit having an input port connected to an output port of the threshold value generation unit, the detection unit having a first output port connected to the other end of the first resistor and further having a second output port, the detection unit being configured to detect the first current and configured such that the detection unit causes a constant detection terminal input current to flow from the detection terminal to the first resistor when an applied voltage applied to the detection terminal is greater than or equal to the voltage of the higher voltage source times the sum of one plus one Nth part; and
    a detection output unit provided between the higher voltage source and the lower voltage source, the detection output unit having an input port connected to the second output port of the detection unit, the detection output unit being configured to receive an output signal from the detection unit and configured such that the detection output unit outputs a first signal to a detection output terminal when the applied voltage is less than the voltage of the higher voltage source times the sum of one plus one Nth part, the detection output unit being configured to output a second signal to the detection output terminal when the application voltage is greater than or equal to the voltage of the higher voltage source times the sum of one plus one Nth part.

2. The voltage detection circuit according to claim 1, wherein the threshold value generation unit includes second to fifth resistors and first to fourth transistors,
    one end of the second resistor is connected to the higher voltage source,
    one end of the third resistor is connected to the other end of the second resistor, the other end of the third resistor is connected to the lower voltage source, and the second resistor and the third resistor constitute a resistance dividing circuit configured to generate the setting voltage equal to one Nth part of the voltage of the higher voltage source between both ends of the second resistor,
    a first terminal of the first transistor is connected to the higher voltage source, and a control terminal of the first transistor is connected to the other end of the second resistor,
    one end of the fourth resistor is connected to a second terminal of the first transistor, and the other end of the fourth resistor is connected to the lower voltage source,
    one end of the fifth resistor is connected to the higher voltage source,
    a first terminal of the second transistor is connected to the other end of the fifth resistor, and a control terminal of the second transistor is connected to the second terminal of the first transistor,
    a first terminal of the third transistor is connected to a second terminal of the second transistor, and a second terminal of the third transistor is connected to the lower voltage source, a first terminal of the fourth transistor is connected to the higher voltage source, a control terminal of the fourth transistor is connected to the first terminal of the third transistor, and a second terminal of the fourth transistor is connected to a control terminal of the third transistor, and wherein the detection circuit includes fifth to tenth transistors, a first terminal of the fifth transistor is connected to the higher voltage source via a first diode, and a control terminal of the fifth transistor is connected to the higher voltage source, a first terminal of the sixth transistor is connected to the other end of the first resistor via a second diode, a first terminal of the seventh transistor is connected to a second terminal of the fifth transistor, and a control terminal of the seventh transistor is connected to a second terminal of the seventh transistor, a first terminal of the eighth transistor is connected to a second terminal of the sixth transistor, a control terminal of the eighth transistor is connected to a control terminal of the seventh transistor, and the eighth and seventh transistors constitute a current mirror circuit, a first terminal of the ninth transistor is connected to the second terminal of the seventh transistor, a control terminal of the ninth transistor is connected to the control terminal of the third transistor, a second terminal of the ninth transistor is connected to the lower voltage source, and the ninth and third transistors constitute a current mirror circuit, and a first terminal of the tenth transistor is connected to a second terminal of the eighth transistor, a control terminal of the tenth transistor is connected to the control terminal of the third transistor, a second terminal of the tenth transistor is connected to the lower voltage source, and the tenth and third transistors constitute a current mirror circuit.

3. The voltage detection circuit according to claim 2, wherein the fifth and sixth transistors are high-voltage MOS transistors.

4. The voltage detection circuit according to claim 2, wherein the first transistor is an NPN transistor and the second transistor is a PNP transistor.

5. The voltage detection circuit according to claim 2, wherein the third, fourth, ninth, and tenth transistors are NPN transistors.

6. The voltage detection circuit according to claim 2, wherein the seventh and eighth transistor are each a P-channel MOS transistor or a P-channel MIS transistor.

7. The voltage detection circuit according to claim 1, wherein the voltage detection circuit is provided in any one of an in-vehicle driver, an industrial device driver, and a consumer device driver.

8. A voltage detection circuit, comprising:

a threshold value generation unit including a first resistor having one end connected to a higher voltage source, and a first diode having a cathode connected to the other end of the first resistor, and having an anode connected to a lower voltage source, the threshold value generation unit being configured to generate a setting voltage equal to one Nth part of a voltage of the higher voltage source between both ends of the first resistor, wherein N is greater than one;

a second resistor having one end connected to a detection terminal;

a detection unit provided between the higher voltage source and the lower voltage source, the detection unit having an input port connected to an output port of the threshold value generation unit, the detection unit having a first output port connected to the other end of the first resistor and further having a second output port, and configured such that a voltage which has been reduced from the voltage of the higher voltage source by the setting voltage is inputted to the detection unit from the threshold value generation unit and the detection unit is connected to the other end of the second resistor, the detection unit being configured to cause a constant detection terminal input current to flow from the detection terminal to the second resistor when an applied voltage applied to the detection terminal is greater than or equal to the voltage of the higher voltage source times the sum of one plus one Nth part; and a detection output unit provided between the higher voltage source and the lower voltage source, the detection output unit having an input port connected to the second output port of the detection unit, the detection output unit being configured to receive an output signal from the detection unit and configured such that the detection output unit outputs a first signal to a detection output terminal when the application voltage is less than the voltage of the higher voltage source times the sum of one plus one Nth part, the detection output unit being configured to output a second signal to the detection output terminal when the application voltage is greater than or equal to the voltage of the higher voltage source times the sum of one plus one Nth part, wherein, when a short-to-power occurs, the detection unit sets the voltage between both ends of the second resistor to the same value as the setting voltage between both ends of the first resistor.

9. The voltage detection circuit according to claim 8 wherein the detection unit includes first and second transistors, first and second current sources, and a comparator, a first terminal of the first transistor is connected to the higher voltage source via a second diode, and a control terminal of the first transistor is connected to the other end of the first resistor, a first terminal of the second transistor is connected to the other end of the second resistor via a third diode, and a control terminal of the second transistor is connected to the other end of the first resistor, one end of the first current source is connected to a second terminal of the first transistor via a fourth diode, and the other end of the first current source is connected to the lower voltage source, one end of the second current source is connected to a second terminal of the second transistor via a fifth diode, and the other end of the second current source is connected to the lower voltage source, and the comparator receives a signal outputted from the one end of the first current source, and a signal outputted from the one end of the second current source and outputs a signal obtained by comparing and amplifying the received signals.

10. The voltage detection circuit according to claim 9, wherein the first and second transistors are high-voltage MOS transistors.

11. An electronic control unit (ECU) comprising:

an output drive unit;

a voltage detection circuit; and a control unit configured to control the output drive unit, the ECU being configured to output an output drive signal from the output drive unit, wherein the output drive unit outputs the output drive signal for operating a target controlled unit via a detection terminal, and wherein the voltage detection circuit includes a threshold value generation unit provided between a higher voltage source and a lower voltage source, and configured to generate a setting voltage equal to one Nth part of a voltage of the higher voltage source and to convert the setting voltage to a first current, wherein N is greater than one, a first resistor having one end connected to the detection terminal, a detection unit provided between the higher voltage source and the lower voltage source, the detection unit having an input port connected to an output port of the threshold value generation unit, the detection unit having a first output connected to the other end of the first resistor and further having a second output port, the detection unit configured to detect the first current and configured such that the detection unit causes a constant detection terminal input current to flow from the detection terminal to the first resistor when an application voltage applied to the detection terminal is greater than or equal to the voltage of the higher voltage source times the sum of one and one Nth part, and a detection output unit provided between the higher voltage source and the lower voltage source, the detection output unit having an input port connected to the second output port of the detection unit, the detection output unit configured to receive an output signal from the detection unit and configured such that the detection output unit outputs a first signal to a detection output terminal when the application voltage is less than the voltage of the higher voltage source times the sum of one and one Nth part, the detection output unit being configured to output a second signal to the detection output terminal when the application voltage is greater than or equal to the voltage of the higher voltage source times the sum of one and one Nth part, and wherein the control unit receives a signal outputted from the detection output unit via the detection output terminal, the control unit being configured to output a control signal to stop an operation of the output drive unit when a voltage applied to the detection terminal is greater than or equal to the sum of the voltage of the higher voltage source and the setting voltage.

12. The ECU according to claim 11,
wherein the control unit is a micro controller unit (MCU).

13. The ECU according to claim 11,
wherein the ECU is installed in an automobile and the higher voltage source, the lower voltage source, and the output drive signal are supplied to a device provided in the automobile via a wire harness.

* * * * *